United States Patent
Matsumoto et al.

(10) Patent No.: US 6,235,366 B1
(45) Date of Patent: May 22, 2001

(54) ADHESIVE SHEET

(75) Inventors: Masatoshi Matsumoto; Mitsugu Koike; Hitoshi Maruhashi, all of Gunma-ken; Yoshihisa Mineura, Tokyo, all of (JP)

(73) Assignee: Lintec Corporation (JP)

( * ) Notice: Subject to any disclaimer, the term of this patent is extended or adjusted under 35 U.S.C. 154(b) by 0 days.

(21) Appl. No.: 09/234,828

(22) Filed: Jan. 21, 1999

(30) Foreign Application Priority Data

Jan. 21, 1998 (JP) .................................................. 10-023948

(51) Int. Cl.$^7$ ............................... B32B 3/04; B32B 33/00; B05D 5/10
(52) U.S. Cl. .................... 428/41.9; 427/207.1; 428/42.1; 428/124; 428/354
(58) Field of Search ..................................... 428/343, 354, 428/41.9, 42.1, 124, 40.1; 427/207.1

(56) References Cited

U.S. PATENT DOCUMENTS

| | | | | |
|---|---|---|---|---|
| 4,853,286 | * | 8/1989 | Marimatsu et al. ................. | 423/343 |
| 5,409,752 | * | 4/1995 | Juteau ................................... | 423/343 |
| 5,637,395 | * | 6/1997 | Uemura et al. ....................... | 428/343 |
| 5,683,806 | * | 11/1997 | Sakumoto et al. .................... | 428/343 |
| 5,851,664 | * | 12/1998 | Bennett et al. ....................... | 428/343 |
| 6,010,782 | * | 1/2000 | Uemura et al. ....................... | 428/343 |

FOREIGN PATENT DOCUMENTS

| | | |
|---|---|---|
| 0150882 | 7/1985 | (EP) . |
| 0157508 | 10/1985 | (EP) . |
| 0570728 | 11/1993 | (EP) . |
| 0571649 | 12/1993 | (EP) . |

* cited by examiner

Primary Examiner—Wayne Langel
(74) Attorney, Agent, or Firm—Morrison Law Firm

(57) ABSTRACT

An adhesive sheet used for semiconductor wafer processing; with the adhesive sheet consisting of a release liner, an adhesive layer and a base film which are laminated in order of description, having a great length and being folded zigzag into equal sections so that one section is superposed exactly upon another.

7 Claims, 1 Drawing Sheet

ADHESIVE SHEET

FIELD OF THE INVENTION

The present invention relates to an adhesive sheet having a base film laminated thereon an adhesive layer and a release liner in this order and, more particularly, to a long piece of adhesive sheet folded zigzag into equal sections so that one section is superposed exactly upon another.

BACKGROUND OF THE INVENTION

In the process of manufacturing semiconductors, an adhesive sheet has hitherto been used for protecting the circuit-formed side of semiconductor wafers at the stage of polishing the back side of the wafers; while, at the dicing stage, it has so far been used for fixing semiconductor wafers to ring frames for dicing. In the former case of using an adhesive sheet for protection, pieces having the same shape as the semiconductor wafers to be protected have been cut from the adhesive sheet. In the latter case of using an adhesive sheet for the dicing, circular pieces with a diameter including the ring frame diameter and a margin to paste up have been cut from the adhesive sheet.

As for the cutting of an adhesive sheet for protection or dicing, there have been known two methods; one method is a pre-cut method wherein a base film having thereon an adhesive layer protected by a release liner is punched in advance so that pieces of the base film with the intended shape are arranged in series and laminated on the release liner via the adhesive layer, and the other method is a batch cut process wherein a roll of long adhesive sheet is prepared without cutting out any unnecessary part and, at the time of use, the unnecessary part is cut out with a cutter so as to leave necessary pieces. The batch cut process requires that the adhesive sheet be fed so as to keep enough distance for the cutting operation. As the part corresponding to this feed distance is useless, the necessary area of an adhesive sheet per silicon wafer becomes larger. Therefore, the batch cut process is inferior in productivity.

According to the pre-cut method, an adhesive sheet used in the process of manufacturing semiconductors, which has a resinous base film laminated via the adhesive layer on a long piece of release liner, is cut from the side of the base film into the surface of the release liner by means of, e.g., a die cutter, and then the base film in the unnecessary part is removed together with the adhesive layer from the release liner to leave only the necessary part of the adhesive layer covered with the base film (hereinafter referred to as the adhesive film) on the release liner.

In storing the thus processed long piece of adhesive sheet, the sheet is cut properly into short pieces of adhesive sheets, and these pieces are superposed one upon another. In another way of storing, the processed long piece of adhesive sheet is wound into a roll. At the time of practical use in the course of manufacturing semiconductors, e.g., at a dicing stage, the pre-cut adhesive film is peeled apart from the release liner and applied to a semiconductor wafer or the like.

However, when the adhesive sheet as the finished product is a roll of the adhesive sheet having only the precut adhesive film on the release liner, it frequently happens that (i) the adhesive sheet is wound in a state that it slips sideways every turn to form a roll having a shape like a bamboo shoot, (ii) the adhesive is forced out of the adhesive film present in the vicinity of the core by the wind pressure, or/and (iii) the adhesive film surface is rendered rough with increase in the winding diameter because adhesive films cannot be superposed, but come to overlap each other and bear the stamp of each other's contour, which causes pitching or damage to chips upon dicing. Thus, inferior goods are liable to be produced in such a case.

If the wind pressure is therefore made lower, it becomes harder to keep the adhesive sheet in roll shape at the time of transportation or use, so that the control of wind pressure is troublesome. On the other hand, when the adhesive films released from the adhesive sheet which was rolled up as it slipped sideways are applied to substrates, it frequently happens that those adhesive films leave part of the adhesive on the substrates when they are peeled away. Such foreign matter left on the substrates is referred to as adhesive deposit. The generation of adhesive deposit becomes a fatal defect of an adhesive sheet, particularly when the adhesive sheet is used in the process of manufacturing semiconductor.

In a case where the pre-cut adhesive sheet is stored in roll shape, it has a drawback of suffering the collection of dust in the gaps formed by cutting off the adhesive film on the both side parts of the roll. In another case where the pre-cut adhesive sheet is stored or transported in a state that it is cut into equal pieces so that every piece has one adhesive film and these pieces are superposed upon one another, the same trouble as mentioned above is caused. In addition to such a dust trouble, the sheet pieces superposed have a defect that it is difficult to automatically feed them to semiconductor wafers.

Therefore, it is also carried out that, after the precuts are made in an adhesive sheet to the depth of the adhesive film, the adhesive sheet is forwarded without removing therefrom unnecessary part of the adhesive film and placed at users' disposal. In this case, however, the necessary and unnecessary parts of the adhesive layer which have once been cut apart come to adhere again to each other with a lapse of time under wind pressure or the like. Thus, easy and exact release of only the necessary part of the adhesive film from the adhesive sheet becomes impossible at the time of use.

Accordingly, it is also put in practice to cut off the adhesive film in an appropriate width on the borders of the necessary part and the unnecessary part. Even if the adhesive sheet is wound into a roll or cut into equal pieces and superposed in such a case, the wind or superposition pressure does not concentrate in a particular part of the adhesive sheet; as a result, the necessary part of the adhesive film suffers neither damage nor deformation and the adhesive layer is prevented from being forced out. In this case, therefore, the necessary part of the adhesive film is peeled apart from the release liner with certainty.

Further, the adhesive sheet stored in a rolled or superposed state is free from the adhesion of dust because it has no gaps in side parts.

However, it frequently occurs in the adhesive sheet of such a type that the partial delamination of the adhesive film is caused even in the part to be left on the release liner upon removal of the adhesive film on the border of the necessary part and the unnecessary part in the course of the production thereof. This phenomenon makes it difficult to continuously produce adhesive sheets of this type. In addition, the disposal of unnecessary part as waste becomes necessary.

In recent years, the tendency to reduce the amount of wastes has been strengthened in conformity with ISO 14001, so that in the case of forwarding the adhesive sheets in a roll form, the recycling and regeneration of roll cores have begun to be required. Thus, new cost is added to the production cost.

SUMMARY OF THE INVENTION

As a result of our intensive study aimed at providing a long piece of adhesive sheet which has high production efficiency, can reduce the users' waste disposal load and can be free from the pressure causing the adhesive layer to be forced out, it has been found that good results can be obtained when a long piece of adhesive sheet is not wound into a roll but folded zigzag into equal sections so that one section is superposed exactly upon another, thereby achieving the present invention.

Therefore, an object of the present invention is to provide an adhesive sheet having excellent quality and ensuring high working efficiency.

The foregoing object of the present invention is attained by an adhesive sheet used for semiconductor wafer processing; with the adhesive sheet having a release liner, an adhesive layer and a base film which are laminated in order of description, having a great length and being folded zigzag into equal sections so that one section is superposed exactly upon another.

DETAILED DESCRIPTION OF THE INVENTION

The base film used in the present invention can be properly selected from the resin films conventionally used as the base film of an adhesive sheet, including a polyethylene (PE) film, a polyvinyl chloride (PVC) film, a polyethylene terephthalate (PET) film, an ethylene-(meth)acrylic acid copolymer film, a polyurethane film and the like.

The adhesive used in the present invention can be properly selected from known adhesives. In a specific case of using the adhesive sheet in a process for manufacturing semiconductors, it is necessary for the adhesive to be free from ionic substances which are apt to contaminate semiconductors. Therefore, it is especially desirable that the adhesive be selected from acrylic adhesives, silicone adhesives or rubber adhesives.

Also, adhesive compositions of the type which are cured by irradiation with ultraviolet light, electron beams or the like (the so-called radiation-curable adhesive compositions) may be employed in the present invention. A general radiation-curable adhesive composition comprises a radiation polymerizable compound having a relatively low molecular weight, specifically a weight average molecular weight of 10,000 or below, so that such an adhesive composition is liable to be forced out when the adhesive sheet having an adhesive layer formed therewith is wound into a roll. On the other hand, as far as the adhesive sheet is folded zigzag according to the present invention, such an adhesive composition can be prevented from being forced out. Thus, the present invention has a remarkable advantage in the case of using such a radiation-curable adhesive composition.

The release liner used in the present invention can be selected properly from known ones. In a case where the adhesive sheet is used in the process of manufacturing semiconductor which are apt to be easily damaged by dust, it is desirable for the release liner to be a resin film treated with a releasing agent. Suitable examples of such a resin film include a polypropylene film and a polyethylene terephthalate film.

The adhesive sheet according to the present invention can be easily produced by coating an adhesive in a layer on a base film surface, putting the adhesive layer on the release-coated face of a release liner, and folding it zigzag into equal sections so that one section is superposed exactly upon another in a known way, e.g., folding it zigzag by perforation made at equal spaces. Also, the adhesive may be coated in a layer on the release-coated face of a release liner, and then a base film may be put on the adhesive layer. The suitable thickness of the base film is from 50 to 300 $\mu$m, that of the adhesive layer is from 10 to 50 $\mu$m, and that of the release liner is from 25 to 50 $\mu$m.

Figure 1:
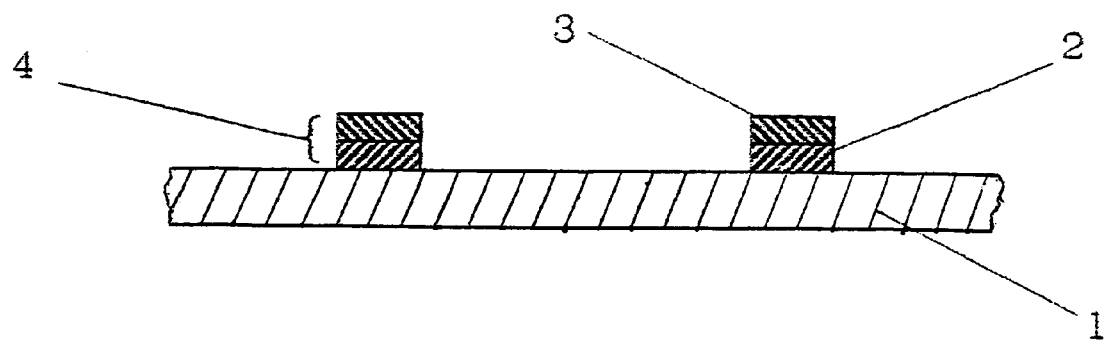
FIG. 1 is a cross-sectional view showing a part of the present adhesive sheet in which unnecessary parts of the adhesive film are removed and necessary parts of the adhesive film are left on the release liner.

The present invention has no particular restriction as to the shape of an adhesive film on the release liner, but the adhesive film may be cut in advance so that only the necessary part thereof, which can have a desired shape, is left on the release liner as shown in FIG. 1, or at least part of the border between the necessary area and the unnecessary area may be cut out from the adhesive film so that the necessary area of the adhesive film may be easily peeled apart from the release liner.

Further, the release liner can be perforated at regular intervals on both sides for the easy feeding at the time of use.

The present adhesive sheet is supplied to a user in a state that the sheet is folded zigzag, and so it requires no core in contrast to the supply in a rolled state; as a result, the present adhesive sheet entails no new cost for the recycling and regeneration of roll cores and enables a great reduction of waste, compared with the conventional case wherein roll cores are disposed of as waste.

As the adhesive sheet according to the present invention is folded zigzag, the pressure imposed thereon during storage is always uniform and, even when the adhesive sheet is produced in a pre-cut state, adhesive films are laid on one another without deviating from the superposed position; as a result, the adhesive films obtained can have good quality. For instance, the present adhesive film leaves no adhesive in a case where, after the present adhesive film is stuck on a wafer, the wafer is polished on the back side or undergoes dicing. Accordingly, the present adhesive sheet is especially useful as an adhesive sheet used in the process of manufacturing semiconductor.

The present invention will now be illustrated in more detail by reference to the following example, but it should be understood that this example is not to be construed as limiting the scope of the invention in any way.

EXAMPLE

An ultraviolet curable adhesive was prepared by adding 100 parts by weight of urethane acrylate having a weight average molecular weight of about 9,000 and 4 parts by weight of benzophenone as a photopolymerization initiator to 100 parts by weight of a copolymer constituted of 97 parts by weight of butyl acrylate and 3 parts by weight of acrylic acid.

Referring to FIG. 1, the acrylic adhesive as prepared above, was coated in a 25 $\mu$m thick layer forming an adhesive layer 2 on the release surface of a long polyester sheet. The sheet was 220 mm wide and 38 $\mu$m thick and had been treated with a silicone releasing agent to form a release liner 1. An 80 $\mu$m thick soft polyvinyl chloride base film 3 was laminated onto the adhesive layer. Circular cuts of 208 mm in diameter were spaced uniformly in the laminate of base film and the adhesive layer, or adhesive film 4. FIG. 1 illustrates a cross sectional view of the adhesive sheet after removal of the unnecessary part of the adhesive film from the release liner.

Figure 2:
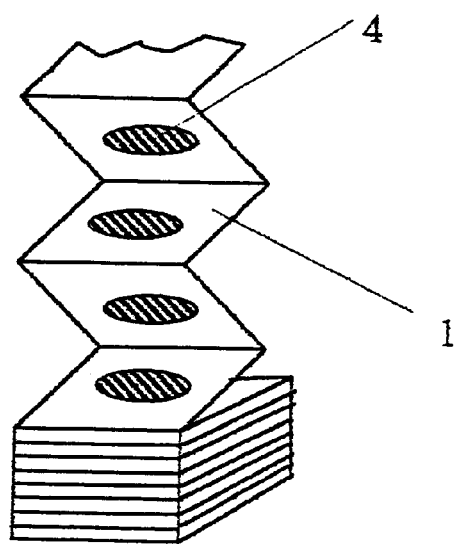
FIG. 2 is a schematic view showing an adhesive sheet according to the present invention.

Further, perforation was made in the release liner from which the unnecessary part of the adhesive film had been removed, and the sheet was folded zigzag into equal sections at the perforation as shown in FIG. 2 to prepare an adhesive sheet according to the present invention. Therein, the position of perforation was determined so that the circular adhesive films (necessary part) remaining on the release liner are superposed exactly upon one another.

By the observation after 2-month storage in a state that the adhesive sheet was folded into hundred, it was confirmed that the adhesive sheet had neither arched stamp on the base film surface nor adhesive forced out of the adhesive film. The adhesive films thus stored were stuck on semiconductor wafers, and the resulting wafers were used in the processing thereof. Therein, the application suitability of the adhesive films was good. After curing the adhesive by irradiation with ultraviolet rays, the adhesive films were peeled from the wafers without adhesive stains left on the wafers.

What is claimed is:

1. An adhesive sheet for semiconductor wafer processing, combing:

a release liner;

an adhesive layer on said release liner;

a base film on said adhesive layer forming an adhesive film; and said adhesive sheet having a means for superimposing corresponding portions of said adhesive film onto adjacent sections of said adhesive film so that pressure is evenly distributed across each of said corresponding portions.

2. An adhesive sheet for semiconductor wafer processing according to claim 1, wherein said adhesive film is cut into necessary part having a series of a desired shape located at equidistant intervals along said adhesive sheet with the remaining adhesive film surrounding said necessary part being removed.

3. An adhesive sheet for semiconductor wafer processing, according to claim 1, wherein said adhesive layer contains a radiation curable adhesive.

4. An adhesive sheet for semiconductor wafer processing, according to claim 2, wherein said adhesive layer contains a radiation curable adhesive.

5. A method of making an adhesive sheet for semiconductor wafer processing, comprising the steps of:

treating one side of a substrate with the releasing agent to form a release liner having a releasing agent coated side;

coating an adhesive layer onto said releasing agent coated side;

laminating a base film onto said adhesive layer forming an adhesive film on said release liner into an adhesive sheet; and folding said adhesive sheet so to superimpose substantially equal sections of said adhesive sheet one upon the other an a zig zag stacked formation.

6. The method according to claim 5, further comprising the step of cutting said adhesive film into a desired shape and removing the unnecessary part of said adhesive film prior to said folding step.

7. The method according to claim 5, comprising the sequential steps of:

cutting said adhesive film into a desired shape;

cutting said adhesive film to form a boarder around said desired shape; and removing said boarder around said desired shape; prior to said folding step.

* * * * *